United States Patent [19]

Hanoka

[11] Patent Number: 5,620,904

[45] Date of Patent: Apr. 15, 1997

[54] METHODS FOR FORMING WRAPAROUND ELECTRICAL CONTACTS ON SOLAR CELLS

[75] Inventor: Jack I. Hanoka, Brookline, Mass.

[73] Assignee: Evergreen Solar, Inc., Waltham, Mass.

[21] Appl. No.: 616,822

[22] Filed: Mar. 15, 1996

[51] Int. Cl.$^6$ .................................................. H01L 31/18
[52] U.S. Cl. ........................ 438/98; 136/256; 257/457; 438/64; 438/118
[58] Field of Search ...................... 437/2, 4–5, 180–181, 437/187–188; 136/256; 257/457

[56] References Cited

U.S. PATENT DOCUMENTS

| | | | |
|---|---|---|---|
| 3,261,074 | 7/1966 | Beauzee et al. | 437/2 |
| 3,350,775 | 11/1967 | Iles | 437/2 |
| 3,411,952 | 11/1968 | Ross et al. | 136/244 |
| 3,489,615 | 1/1970 | Mann et al. | 136/256 |
| 3,493,822 | 2/1970 | Iles | 136/256 |
| 3,502,507 | 3/1970 | Mann et al. | 136/244 |

(List continued on next page.)

FOREIGN PATENT DOCUMENTS

| | | | |
|---|---|---|---|
| 60-783 | 1/1985 | Japan | 136/256 |
| 62-189763 | 8/1987 | Japan | 136/256 |
| 2-384 | 1/1990 | Japan | 136/256 |
| 4-3471 | 1/1992 | Japan | 136/256 |
| WO89/12911 | of 1989 | WIPO . | |

OTHER PUBLICATIONS

D.K. Zemmrich et al, *14th IEEE Photovoltaic Specialists Conference* (1980), pp. 178–183.

NASA Tech. Briefs, Spring 1979, vol. 4, No. 1, pp. 3–4.

Technical Information Bulletin, pp. 1–4, Philadelphia Decal Co. (1993).

How to Use Decals in Decorating pp. 1–4, Philadelphia Ceramics, Inc. *Publication Date Unknown.

"The Making of A Decal"; *The Plate Collector* (Dec. 1985) pp. 33–35.

Cavicchi et al.; "Large Area Wraparound Cell Development"; 17th IEEE (1984) pp. 128–133.

Michaels et al.; "Large Area, Low Cost Space Solar Cells with Optional Wraparound Contacts"; IEEE (1981) pp. 225–227.

Mason et al.; "Development of 2.7 mil BSF and BSFR Silicon Wrapthrough Solar Cells"; IEEE (1990) pp. 1378–1382.

Gee et al.; "Emitter Wrap–Through Solar Cell"; IEEE (1993) pp. 265–270.

Thornhill; Final Report –Automated Fabrication of Back Surface Field Silicon Solar Cells with Screen Printed Wraparound Contacts (1977) pp. 1–30, NASA Contract NAS 3-20029.

*Primary Examiner*—Aaron Weisstuch
*Attorney, Agent, or Firm*—Testa, Hurwitz & Thibeault, LLP

[57] ABSTRACT

Methods for forming a wraparound electrical contact on a solar cell require minimal labor and result in high device yields at low cost. A decal having a patterned electrically conductive material is disposed on a first surface of the solar cell. The decal may be a liquid-transfer or heat-transfer decal. A portion of the decal is wrapped around at least one edge of the solar cell for contacting a second surface of the solar cell. The decal is processed to remove organic matter and form an ohmic contact.

25 Claims, 6 Drawing Sheets

U.S. PATENT DOCUMENTS

| | | | |
|---|---|---|---|
| 3,903,427 | 9/1975 | Pack | 250/208.2 |
| 3,903,428 | 9/1975 | DeJong | 136/244 |
| 3,990,100 | 11/1976 | Mamine et al. | 257/437 |
| 4,104,084 | 8/1978 | Evans, Jr. | 136/256 |
| 4,133,697 | 1/1979 | Frosch et al. | 136/245 |
| 4,135,290 | 1/1979 | Evans et al. | 437/2 |
| 4,173,820 | 11/1979 | Frosch et al. | 437/29 |
| 4,289,920 | 9/1981 | Hovel | 136/246 |
| 4,361,950 | 12/1982 | Amick et al. | 437/2 |
| 4,415,607 | 11/1983 | Denes et al. | 427/96 |
| 4,415,780 | 11/1983 | Daugherty et al. | 200/5 A |
| 4,543,444 | 9/1985 | Rasch et al. | 136/256 |
| 4,610,077 | 9/1986 | Minahan et al. | 437/2 |
| 4,652,693 | 3/1987 | Bar-On | 136/251 |
| 4,695,674 | 9/1987 | Bar-On | 136/256 |
| 4,755,866 | 7/1988 | Marshall et al. | 257/668 |
| 4,758,926 | 7/1988 | Herrell et al. | 361/385 |
| 4,849,028 | 7/1989 | Krause et al. | 136/259 |
| 4,860,444 | 8/1989 | Herrell et al. | 29/840 |
| 4,897,123 | 1/1990 | Mitsui et al. | 136/357 |
| 4,912,288 | 3/1990 | Atkinson et al. | 174/251 |
| 5,055,907 | 10/1991 | Jacobs | 257/773 |
| 5,108,541 | 4/1992 | Schneider et al. | 216/19 |
| 5,116,459 | 5/1992 | Kordus et al. | 216/20 |
| 5,151,377 | 9/1992 | Hanoka et al. | 437/2 |
| 5,266,125 | 11/1993 | Rand et al. | 136/257 |
| 5,425,816 | 6/1995 | Cavicchi et al. | 136/256 |

METHODS FOR FORMING WRAPAROUND ELECTRICAL CONTACTS ON SOLAR CELLS

GOVERNMENT INTEREST

The subject matter described herein was supported in part by SBIR Phase I Contract No. DE-FG02-94ER81763.

FIELD OF THE INVENTION

This invention relates to methods for electrically connecting solar cells and, more particularly, to methods for fabricating wraparound electrical contacts for solar cells.

BACKGROUND

Solar cells are semiconductor devices that convert sunlight into electricity. Typically, solar cells are replicated over an area and interconnected in series and in parallel to form solar cell arrays. These arrays are distributed over a surface and encased in an enclosure to form a solar cell panel. Solar cells are used as sources of electricity for both terrestrial and space applications. The key challenge in making terrestrial solar cells into a widespread source of electricity that is competitive with more conventional forms of electrical generation is in lowering the manufacturing cost.

An area in which the manufacturing cost of terrestrial solar cells requires reduction is that of the interconnection of the solar cells. For crystalline silicon solar cells, a common method for interconnecting solar cells involves the use of "over-andunder" contacts of a generally Z-shaped configuration. These contacts connect the back side of one solar cell to the front side of an adjacent solar cell. This procedure requires being able to access first the front of one solar cell and then the back of the adjacent cell. The result is a slow, expensive manufacturing step with high capital costs and high labor costs.

An alternative to the Z-shaped configuration is a wraparound contact. A wraparound contact includes a front contact which is wrapped around the edges of the solar cell making it accessible from the back of the cell along with the back contact. Wraparound contacts have the potential for significant cost reduction and avoid the foregoing disadvantages of known interconnection procedures. Furthermore, using a wraparound approach, the individual solar cells may be packed more densely. Increased packing density is advantageous since a greater proportion of the solar panel surface is available to collect sunlight. This provides increased energy output per unit surface area of solar panel, a result generally desirable for all solar cell applications.

The formation of a wraparound metal contact has been implemented through various techniques. One method involves photolithographic deposition of a metal directly onto the surface of a solar cell by sputtering or vacuum evaporation. Another method, for forming a version of wraparound contacts termed "wrap-through" contacts, uses a laser to form holes or channels so that the front contact can be brought to the back side of the solar cell. Yet another method is screen printing of a conductive metal-glass paste directly onto the surface of a solar cell. See, for example, U.S. Pat. Nos. 4,135,290; 4,361,950; 4,897,123; and 5,425,816 for disclosure of methods for fabricating wraparound contacts on solar cells.

The aforementioned wraparound methods for solar cells tend to be costly, slow, and not readily adaptable to automation. As a consequence, none of these methods satisfy the need for a low cost manufacturing method for wraparound contacts for terrestrial solar cells.

SUMMARY OF THE INVENTION

The present invention contemplates methods for forming a wraparound electrical contact on a solar cell using a decal process that results in a high yield of viable devices. The decal processes contemplated are relatively uncomplicated such that the labor required is minimal. The simplicity of the process and low labor requirement also serve to enhance device yields. Another advantage of forming wraparound contacts using a decal process is the low cost of contact fabrication. Cost reduction in the production of solar cell panels reduces end user costs and serves to promote the wide-spread use of environmentally-benign solar energy.

In one embodiment, the invention features a method of forming a wraparound electrical connection on a solar cell. A decal, patterned with electrically conductive material (e.g., a silver paste) is disposed on a first surface of the solar cell. A portion of the decal is wrapped around at least one edge of the solar cell for contacting a second surface of the cell. The first surface of the solar cell may comprise the surface exposed to the sun, any of the sides of the solar cell, or the back side of the device. The first surface may be the diffused surface of the solar cell and may be covered with an anti-reflective coating. The second surface may also be any surface or side of the solar cell distinct from the first surface.

After being wrapped around the solar cell, the decal is processed to form an ohmic contact and to remove organic matter that may be present in the decal carrier material and the electrically conductive material. Processing may comprise heating the solar cell.

In another embodiment, the invention features a method of forming a wraparound electrical connection on a solar cell using a liquid-transfer decal. A decal, having a patterned electrically conductive material, is removably disposed on a base material such as starch-coated paper. A liquid is applied to the decal to separate it from the base material. Once separated, the decal is transferred to a first surface of the solar cell. A portion of the decal is then wrapped around at least one edge of the solar cell to a second surface of the cell. Any excess liquid disposed between the decal and the solar cell is removed, such as through mild pressure drying. The decal is then processed to remove organic matter and form an ohmic contact. Processing may comprise heating the solar cell.

In yet another embodiment, the invention features a method of forming a wraparound electrical connection on a solar cell using a heat-transfer decal. A decal having a patterned electrically conductive material is provided. The decal is disposed on a wax surface of a base material. The decal is separated from the base material by the application of heat to the decal. The decal is then transferred from the wax surface to a first surface of the solar cell, which can also be heated. A portion of the decal is wrapped around at least one edge of the solar cell to a second surface of the cell. The decal is then processed to remove organic matter and form an ohmic contact. Processing may involve heating the solar cell.

The foregoing and other objects, aspects, features, and advantages of the invention will become more apparent from the following description and from the claims.

BRIEF DESCRIPTION OF THE DRAWINGS

These and other features of the invention are more fully described below in the detailed description and accompanying drawings of which the figures illustrate the methods for forming wraparound contacts on solar cells.

DETAILED DESCRIPTION

The invention contemplates methods for forming a wraparound electrical contact on a solar cell which can significantly reduce manufacturing costs for terrestrial solar cells by simplifying the interconnection of such cells. Wraparound contacts on solar cells enable high performance due to low grid obscuration of the exposed surface of the cells. Packing density of cells employing wraparound contacts in a module is increased, which further improves energy efficiency. In addition, confining interconnection circuitry to the rear of the devices creates a more uniform appearance, important for consumer applications where aesthetics are a consideration.

More particularly, the invention features methods for fabricating wraparound contacts on solar cells using a decal process. These methods result in high device yields at low cost. Labor demands in manufacture are low, specialized equipment is unnecessary, and the procedures may be rapidly performed. Furthermore, these methods are uncomplicated and amenable to automation and mass-production.

Figure 1A:
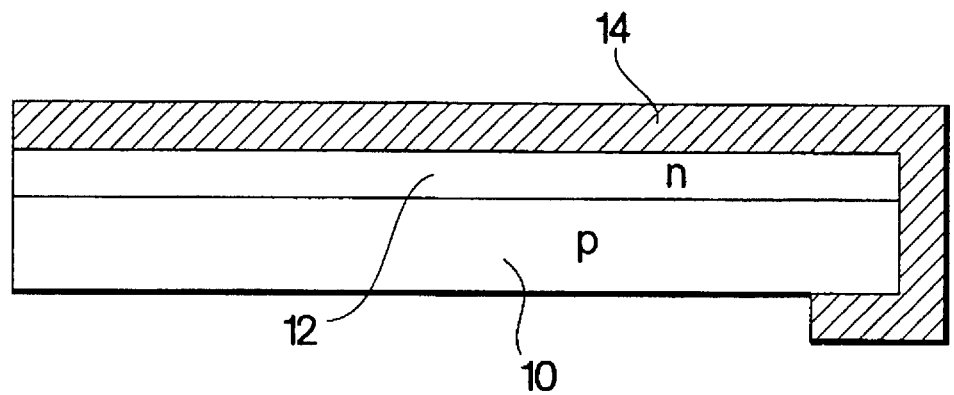
FIGS. 1A and 1B illustrate wraparound contacts on a solar cells.
Figure 1B:
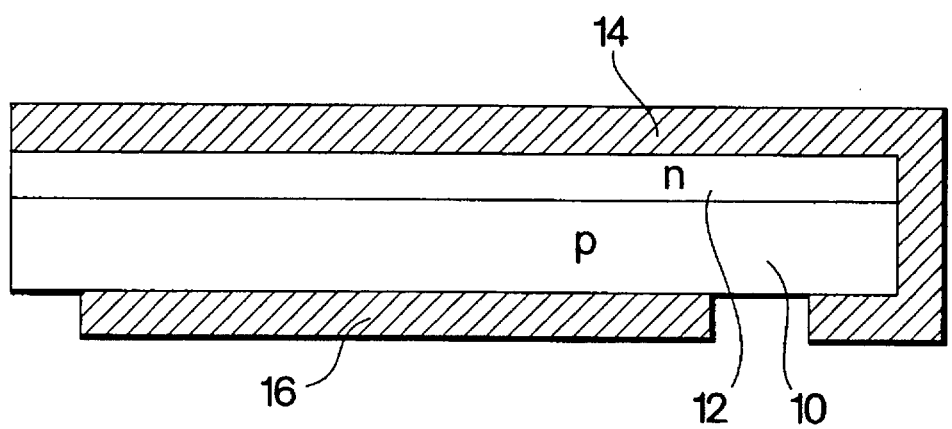

FIGS. 1A and 1B illustrate wraparound contacts on solar cells. FIG. 1A shows a solar cell comprising a p-type substrate 10 with an n-type diffused region 12. A wraparound contact 14, adjacent the front surface of the cell which is exposed to the sun, wraps around the side of the device and is terminated on the back side. The wraparound contact 14 may be any conductive material, such as nickel, aluminum, or silver. FIG. 1B shows both a front wraparound contact 14 and a rear contact 16. The front wraparound contact 14 may be fabricated using a decal process. The rear contact 16 may be fabricated through processes known in the art or may be similarly affixed using a decal process. Both the wraparound contact 14 and rear contact 16 may be disposed on the cell by means of a single patterned decal.

Figure 2A:
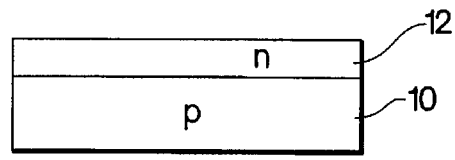
FIGS. 2A–2D illustrate a method of forming a wraparound contact on a solar cell.
Figure 2B:
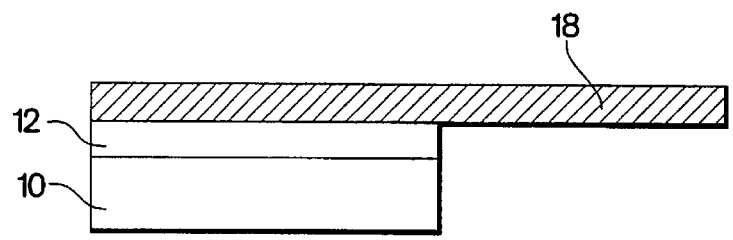
Figure 2C:
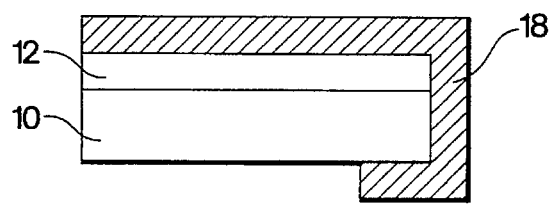
Figure 2D:
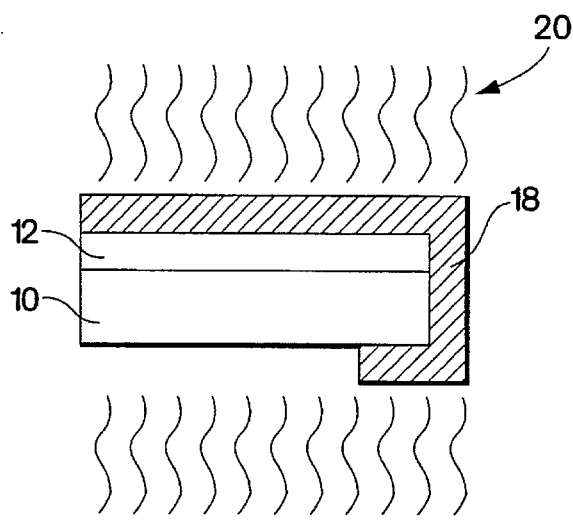

FIGS. 2A–2D illustrate a method of forming a wraparound contact on a solar cell. FIG. 2A shows a solar cell comprising a p-type substrate 10 with an n-type diffused region 12. In FIG. 2B, a decal 18, patterned with electrically conductive material, is disposed on a surface of the solar cell. The surface may be coated with an anti-reflective coating, e.g., titanium dioxide or silicon nitride, to increase energy efficiency of the device. Alternatively, the surface may be coated with anti-reflective coating material before applying the decal onto the surface of the solar cell. In FIG. 2C, the decal is wrapped around a side of the cell. FIG. 2D shows the decal being processed 20, such as by heating, to remove organic material from the decal and form ohmic contact between the decal metallization and the cell. An anti-reflective coating may be deposited on the surface of the cell once contacts are formed if such a coating has not already been applied. When the anti-reflective material is applied to the solar cell before the decal, the wraparound metalization is tired through the anti-reflective coating.

Figure 3A:
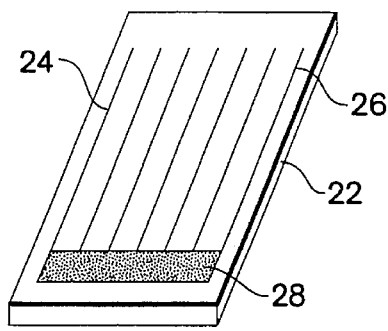
FIGS. 3A–3D illustrate of a method of separating a liquid-transfer decal from a base material for use in forming a wraparound contact.

The decal used in the subject wraparound methods may be of several types. FIGS. 3A–3D illustrate a method of separating a liquid-transfer decal from a base material for use in forming a wraparound contact. A water-absorbent starch-coated paper 22 is the base upon which a decal 24 is printed (FIG. 3A). The decal 24 may be printed using screen printing, offset lithography, extrusion, or any suitable thick film printing technique known in the art. A cover coat of an acrylic-based material is printed or sprayed over the decal pattern to support and bind the decal 24. A typical decal metallization pattern for fabrication of a front contact on a solar cell consists of a plurality of thin fingers 26 appended to a busbar 28.

Figure 3B:
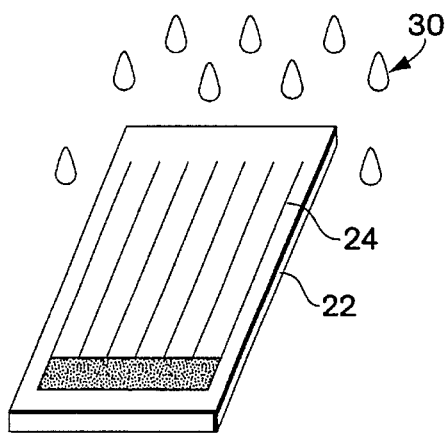
Figure 3C:
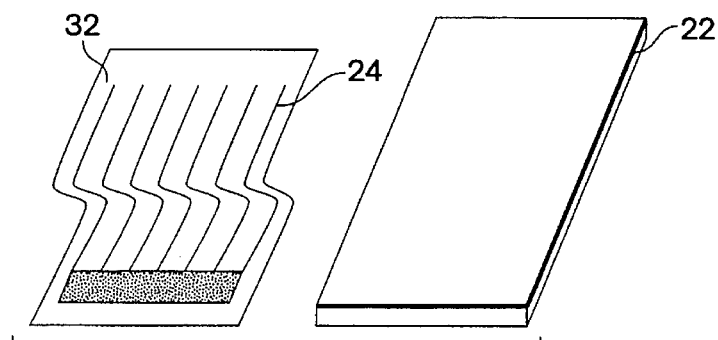
Figure 3D:
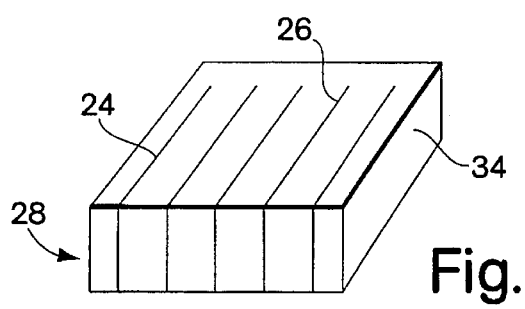

The decal 24 is wet by either being sprayed with water 30 or immersed therein (FIG. 3B). The starch paper curls and this effects a separation of the decal 24, supported by binding carrier material 32, from the water-absorbent paper 22 (FIG. 3C). The decal is wrapped around a solar cell 34 so that the fingers 26 wraparound to the rear of the cell 34 and terminate at the busbar 28 (FIG. 3D). The paper can be coated with a material which provides a temporary adhesive to affix the decal 24 to the solar cell 34.

It is typically desirable to remove excess water disposed between the decal 24 and the solar cell before further processing. This may be accomplished by a number of techniques, including through mechanical pressure. The cell and decal 24 are then dried to ensure that the decal 24 is in intimate contact with the juxtaposed surfaces of the cell. The cell and decal may be dried at either ambient temperature or an elevated temperature. The decal is then fired. Organic material associated with the binders in the metallization paste, and used to give the paste the desired viscoelastic properties, and the organic materials associated with the decal are volatilized during the firing cycle.

The firing profile is optimized for the dimensional and electronic parameters of the substances used to form contacts. One object of the firing process is to obtain uniform adhesion across the solar cell and to adequately volatilize organics. For example, if the metallization consists of silver paste, a spike-firing profile is effective. Spike-firing involves heating the cell to the desired peak temperature and then rapidly cooling it. At its peak, the spike portion of the thermal profile may reach 800° C. If the surface of the silicon is coated with an anti-reflective material, a firing cycle is implemented to ensure that the metallization fires through the anti-reflective coating to form proper electrical contact between the electrode and the underlying diffused region of the solar cell.

It is advantageous to use a decal with metallization comprising a frit-bonded material, such as frit-bonded silver paste. Frit-bonded paste comprises glass frit that becomes molten under standard firing conditions and then dissolves a small surface region of the underlying silicon. If the surface of the diffused region has an anti-reflective coating, such as silicon nitride or titanium dioxide, the glass frit dissolves the adjacent portion of the anti-reflective coating, yielding access of the metallization to the underlying diffused region. When the cell is properly fired, a strong mechanical bond is formed to the surface of the cell and ohmic contact to the diffused layer is produced. If improperly fired, however, organics may not be adequately removed, which can result in the oxides of the glass frit being reduced. When the frit is reduced, it cannot form an adequate contact, either electrically or mechanically, to the silicon substrate.

Figure 4A:
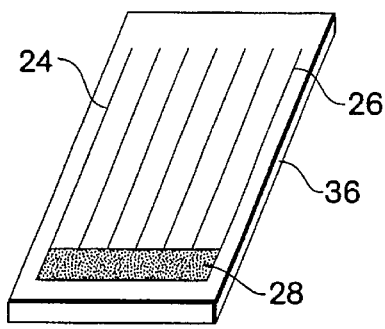
FIGS. 4A–4D illustrate a method of separating a heat-transfer decal from a base material for use in forming a wraparound contact.

FIGS. 4A–4D illustrate a method of separating a heat-transfer decal from a base material for use in forming a wraparound contact. A decal 24 is disposed on a waxen surface of a base material 36. (FIG. 4A). The decal may be formed on the base material 36 using any suitable thick film deposition technique. A typical decal metallization pattern with thin fingers 26 and a busbar 28 is exhibited.

Figure 4B:
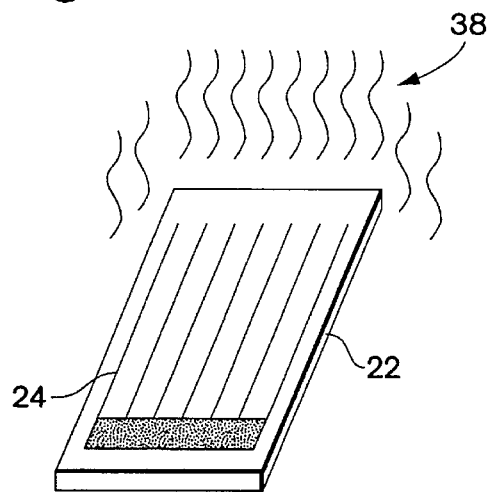
Figure 4C:
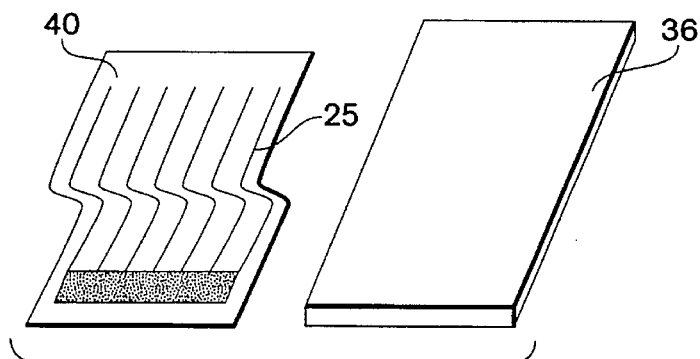
Figure 4D:
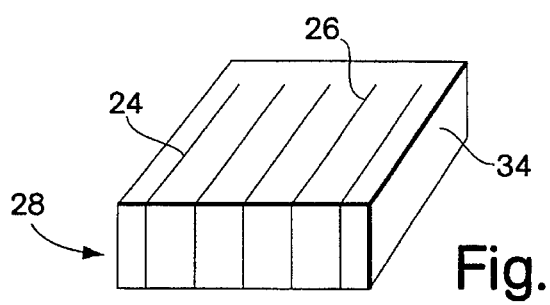

The decal is heated 38 to soften the wax and loosen the decal 24 from the base material 22. (FIG. 4B). The decal, comprising a metallization pattern 25 supported by a binding carrier material 40, is then separated from the base material 36. (FIG. 4C). The decal is wrapped around a solar cell 34, which can also be heated slightly, so that the fingers 26 extend to the rear of the cell and terminate at the busbar 28. (FIG. 4D). The softened wax may provide a temporary adhesive to affix the decal 24 to the solar cell 34.

The cell and decal are fired to volatilize any organic material present and form an ohmic contact between the metallization and the solar cell. If a frit-bonded paste is used, the glass frit facilitates fusion of the conductive metal to the adjacent surfaces of the solar cell and forms an ohmic electrical connection to the diffused layer.

Figure 5A:
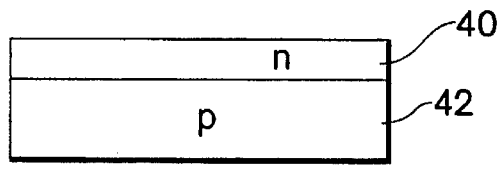
FIGS. 5A–5D illustrate various means for electrically isolating a front contact from a rear of the solar cell.
Figure 5B:
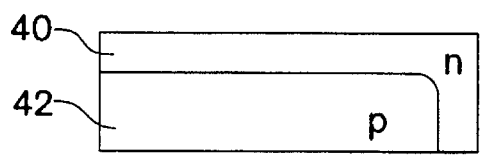
Figure 5C:
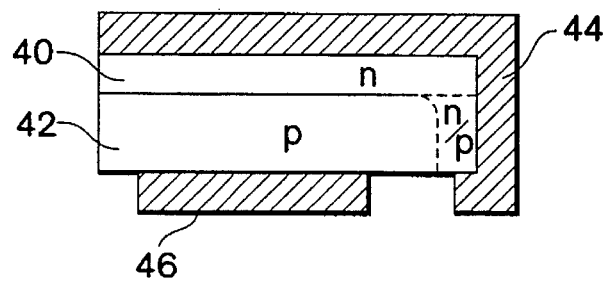

FIGS. 5A–5D illustrate various means for electrically isolating a front contact from a rear contact of the solar cell. When a solar cell with a wraparound contact is fabricated, a junction isolation step may be introduced to preclude electrical communication between the front and rear contacts. A solar cell is depicted in FIG. 5A in which an n-type diffused layer 40 is electrically decoupled to a p-type base region 42. One method of electrically isolating the front and rear electrodes, both terminated on the rear of the cell, is to apply them to a solar cell in which the p-n junction itself is wrapped around the cell, illustrated in FIG. 5B. The junction may not extend fully to the rear of the cell, but may terminate on the edge of the cell. A continuous, belt furnace diffusion process for forming a wraparound p-n junction in a solar cell is known in the art. As shown in FIG. 5C, a wraparound contact 44, terminated on the rear of the cell prior to intersection with the junction, is physically isolated from the rear contact 46.

FIG. 5C also exhibits a solar cell with a wraparound contact in which the junction is not wrapped around the cell, but rather terminates at the edge of the cell as in FIG. 5A. In this case, the front contact 44 is terminated on the p-type bulk material of the base 42. Reverse current leakage or shunting is obviated by forming the wraparound contact with a paste that produces an ohmic contact on the n-type diffused region 40, but a high shunt resistance rectifying contact on the p-type silicon 42. Such pastes are readily available commercially.

Figure 5D:
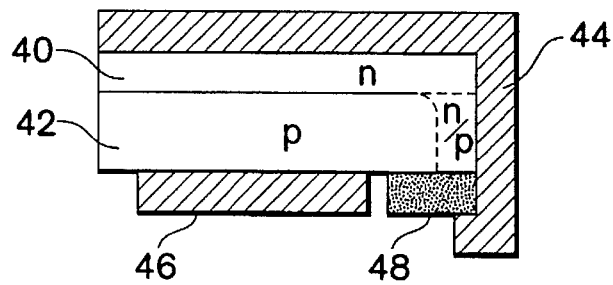

As depicted in FIG. 5D, a dielectric coating 48 may be deposited on the solar cell to isolate the front contact 44 from the p-type base material 42. If the junction extends to the rear of the cell then the dielectric coating 48 may be deposited on the rear of the cell. If the junction terminates along the edge of the cell, then the dielectric coating 48 may extend partially or completely along the edge of the cell to the rear of the cell, effecting electrical isolation. Alternatively, an anti-reflective coating may be applied, and the metallization is fired through such coating. If the anti-reflective coating extends along the edge of the cell, it may effect electrical isolation obviating the need for further dielectric coating.

Figure 6A:
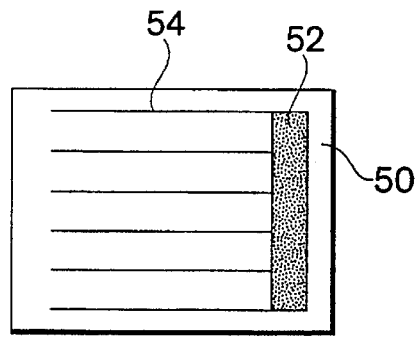
FIGS. 6A–6C illustrate various decal metallization patterns.
Figure 6B:
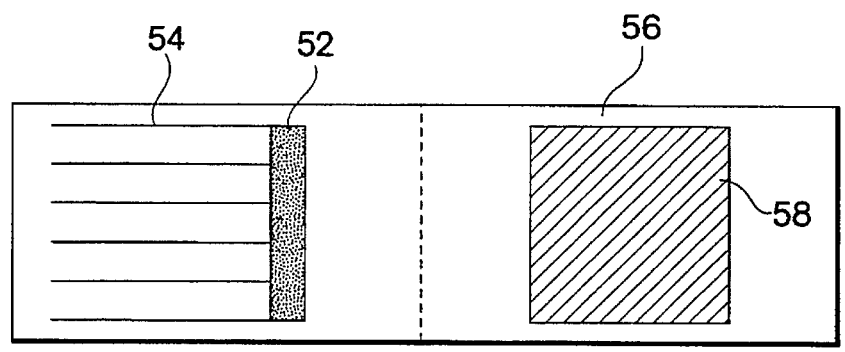

FIGS. 6A–6B illustrate various decal metallization patterns. As shown in FIG. 6A, a decal 50 comprises patterned metallization which may be a single or multiple component system comprising metal, metallic alloys, or any suitable conductive material, as well as binder and glass frit. The metallization may be patterned into fingers 54 and a busbar 52. In one embodiment, silver paste with glass frit is used for metallization patterned to form contact to the diffused layer of the cell.

FIG. 6B features the design of a decal containing metallization patterned to form both front and rear contacts in a single process. Metallization for a front contact, comprising a silver frit-bonded paste, patterned to form fingers 54 and a busbar 52, resides on the same carrier material 50 as aluminum paste patterned for formation of a rear contact 58. Alternatively, as indicated by the dotted line in FIG. 6B, the front and rear contacts may be formed using two or more independent decals.

Figure 6C:
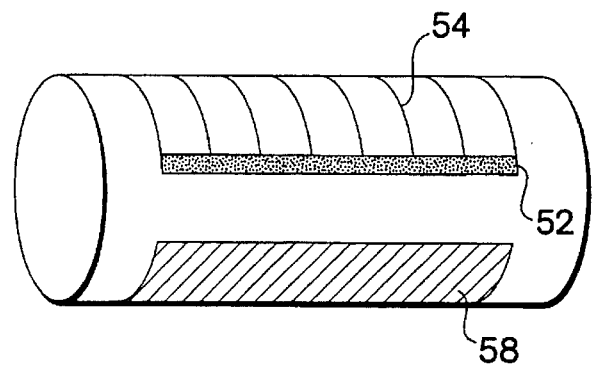

The decals exhibited in FIGS. 6A–6B are planar, but other geometrical configurations have been contemplated. For example, a decal may be formed with a tube morphology such that the wraparound contact is formed by sliding the solar cell into the tube circumscribed by the decal. (FIG. 6C). The decal may comprise a binding carrier material that shrinks as it is processed to wrap the metallization around the cell. Heat shrink tubing may be implemented as a carrier material.

Experimental Results

Reasonably efficient wraparound decal solar cells on polycrystalline substrates have been fabricated. A typical cell had a measured AM1.5 efficiency of 12.3%, a $V_{oc}$=0.57V, and $J_{sc}$=31.4 mA/cm$^2$ and a fill factor of 0.69.

Equivalents

While the invention has been particularly shown and described with reference to specific preferred embodiments, it should be understood by those skilled in the art that various changes in form and detail may be made therein without departing from the spirit and scope of the invention as defined by the appended claims. For example, although certain figures herein illustrate a front contact in which the thin fingers are wrappped around the edges of the solar cell, it is within the scope the invention to wrap the busbars around the edges of the cell.

I claim:

1. A method of forming a wraparound electrical contact on a solar cell, comprising:

disposing a decal having a patterned electrically conductive material on a first surface of the solar cell;

wrapping a portion of the decal around at least one edge of the solar cell for contacting a second surface of the solar cell; and processing the decal to remove organic matter and form an ohmic contact.

2. The method of claim 1 wherein the decal is disposed on a base material.

3. The method of claim 2 wherein the base material is a water-sensitive paper.

4. The method of claim 2 further comprising transferring the decal from the base material to the first surface of the solar cell.

5. The method of claim 2 wherein the base material comprises a wax coating.

6. The method of claim 1 further comprising heating the decal.

7. The method of claim 1 further comprising applying a liquid to the decal for separating the decal from the base material.

8. The method of claim 7 wherein the liquid is water.

9. The method of claim 7 further comprising removing excess liquid disposed between the decal and the solar cell.

10. The method of claim 1 wherein the first surface of the solar cell is a diffused surface.

11. The method of claim 1 wherein the first surface of the solar cell contains an anti-reflective coating.

12. The method of claim 1 wherein the second surface of the solar cell is opposite the first surface.

13. The method of claim 1 wherein processing the decal comprises:

drying the decal; and heating the decal.

14. The method of claim 1 wherein the solar cell comprises a p-n junction wrapped around the edges of the solar cell.

15. The method of claim 1 further comprising depositing a dielectric coating on the at least one edge of the solar cell.

16. The method of claim 1 wherein a conductive pattern comprising the decal is formed by screen printing.

17. The method of claim 1 wherein the electrically conductive pattern forms a front contact on the first surface of the solar cell and a rear contact on the second surface of the solar cell.

18. The method of claim 1 wherein processing the decal comprises heating the decal.

19. A method of forming a wraparound electrical contact on a solar cell, comprising:

providing a decal having a patterned electrically conductive material and disposed on a base material;

applying a liquid to the decal for separating the decal from the base material;

transferring the decal from the base material to a first surface of the solar cell;

wrapping a portion of the decal around at least one edge of the solar cell to a second surface of the solar cell;

removing excess liquid disposed between the decal and the solar cell; and processing the decal to remove organic matter and form an ohmic contact.

20. The method of claim 19 wherein the base material is water-sensitive paper and the liquid is water.

21. The method of claim 19 wherein the first surface of the solar cell is a diffused surface and includes an anti-reflective coating.

22. The method of claim 19 wherein the solar cell comprises a p-n junction wrapped around the edges of the solar cell.

23. The method of claim 19 wherein the electrically conductive pattern forms a front contact on the first surface of the solar cell and a rear contact on the second surface of the solar cell.

24. The method of claim 19 wherein processing the decal comprises drying the decal; and heating the decal.

25. A method of forming a wraparound electrical contact on a solar cell, comprising:

providing a decal having patterned electrically conductive material and disposed on a wax-coated surface;

heating the decal;

transferring the heated decal from the wax-coated surface to a first surface of the solar cell;

wrapping a portion of the decal around at least one edge of the solar cell to a second surface of the solar cell; and processing the decal disposed on the solar cell to remove organic matter and form an ohmic contact.

* * * * *